United States Patent [19]

Bindal et al.

[11] Patent Number: 5,262,346
[45] Date of Patent: Nov. 16, 1993

[54] NITRIDE POLISH STOP FOR FORMING SOI WAFERS

[75] Inventors: Ahmet Bindal, Hopewell Junction, N.Y.; James E. Currie, Washington, N.Y.

[73] Assignee: International Business Machines Corporation, Armonk, N.Y.

[21] Appl. No.: 991,222

[22] Filed: Dec. 16, 1992

[51] Int. Cl.$^5$ .......................................... H01L 21/302
[52] U.S. Cl. .......................................... 437/62; 437/68; 437/947; 437/981; 148/DIG. 168; 156/630; 156/636; 156/649
[58] Field of Search .................. 156/636, 630, 649; 437/62, 947, 981, 68; 148/DIG. 168

[56] References Cited

U.S. PATENT DOCUMENTS

| | | |
|---|---|---|
| 3,911,562 | 10/1975 | Youmans . |
| 4,408,386 | 10/1983 | Takayashiki et al. ............ 437/62 |
| 4,735,679 | 4/1988 | Lasky ............................... 437/62 |
| 4,824,795 | 4/1989 | Blanchard ........................ 437/62 |
| 4,971,925 | 11/1990 | Alexander et al. .............. 437/62 |
| 5,124,274 | 6/1992 | Ohki et al. ....................... 437/68 |

FOREIGN PATENT DOCUMENTS

| | | | |
|---|---|---|---|
| 62-247540 | 10/1987 | Japan | 437/62 |
| 1-49240 | 2/1989 | Japan | 437/62 |

Primary Examiner—Brian E. Hearn
Assistant Examiner—Laura M. Holtzman

[57] ABSTRACT

A method of forming a SOI integrated circuit includes defining thin silicon mesas by wet etching a device layer having the <100> orientation down to the underlying insulator so that the (111) crystal planes control the lateral etching, forming a nitride bottom polish stop in the bottom of the apertures by a low temperature CVD process, with nitride sidewalls on the (111) planes of the silicon mesas being susceptible to easy removal, so that no hard material is present during a chemical-mechanical polishing step to thin the device layer down to less than 1000 Å, and filling the apertures with a temporary layer of polysilicon to provide mechanical support to the edges of the device layer during the polishing operation.

10 Claims, 2 Drawing Sheets

NITRIDE POLISH STOP FOR FORMING SOI WAFERS

TECHNICAL FIELD

The field of the invention is that of forming SOI integrated circuits using bonded oxide wafers, in which the thin silicon device layer is polished down to a smaller thickness.

BACKGROUND ART

Extensive work has been done in the field of silicon on insulator (SOI) integrated circuits, in which two wafers of silicon are bonded together with an oxide layer in between. One of the two wafers is ground or otherwise thinned down to the desired thickness. Commercially available wafers have a top silicon device layer having a nominal thickness of 2 $\mu m \pm 0.3$ $\mu m$. The art has long sought the development of a device layer of thinner dimensions in order to isolate the final devices from each other and also to produce fully depleted CMOS field effect transistors, which, for standard voltages and doping concentrations, require a device layer of thickness less than 1000 Å.

Thin device layers made by implanting oxygen and forming the buried oxide insulating layer in situ (SIMOX) are commercially available, but the top surface of the buried insulator normally has crystal defects that produce leaky devices.

U.S. Pat. No. 4,735,679 illustrates a technique for providing thin uniform layers of top silicon, called device silicon, above an underlying oxide insulator to form SOI integrated circuits. This patent illustrates a technique in which a polish stop of refractory metal, defined by a lift off technique, is used to define the uniformity of the silicon device layer.

U.S. Pat. No. 4,824,795 illustrates a process that uses a concentration dependent oxidation process which leads to a RIE step that is not well controlled and therefore will have manufacturing difficulty. Further, the use of side crystallization of the polysilicon means that defects in the crystal structure will be located in the transistor area.

One skilled in the art would not consider the use of a wet etch process for devices in SOI having a device layer thickness of about 1000 Å because such devices use small linewidths (less than 1 $\mu m$) for which the horizontal etching characteristic of wet etches is considered intolerable.

SUMMARY OF THE INVENTION

The invention relates to a process for forming thin (1000 Å or less) silicon on insulator (SOI) for submicron CMOS technology. To form these thin silicon mesas on insulator, the device layer oriented in the <100> direction is etched down to the buried oxide using KOH as etchant through an aperture in a temporary nitride layer, forming a polish stop aperture with slanting sidewalls with the (111) planes of the device layer serving as a lateral etch stop. After removing the temporary nitride layer, a polish stop nitride layer of controlled thickness is deposited on the bottom of the apertures and on the sides, after which the nitride outside the bottom of the aperture is removed to leave a set of polish stops on the bottom of the aperture that will define the thickness of mesas in the device layer. The silicon device layer is then polished down to the height of these polish stops and transistors are formed in the silicon mesas.

BEST MODE OF CARRYING OUT THE INVENTION

Figure 1:
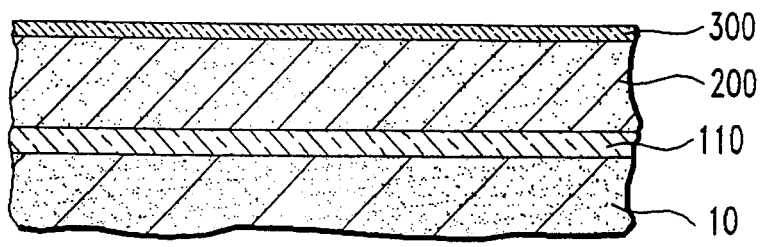
FIGS. 1 through 8 illustrate in cross-section an area of an integrated circuit wafer being formed according to the invention.

Referring now to FIG. 1, there is shown a silicon substrate 10 having a conventional thickness at the top of which a bonding oxide layer 110 forms the bond between wafer 10 and the thinned down device layer 200, which originally was a second silicon wafer of the same thickness as wafer 10 and having the <100> orientation. Device layer 200 has been thinned down from its commercial thickness of 2 $\mu m$ to a thickness of less than 1 $\mu m$ by repeated steps of oxidation, as is known in the art. The top layer 300 is a temporary protective layer of nitride having a nominal thickness of 2000 Å.

Figure 2:
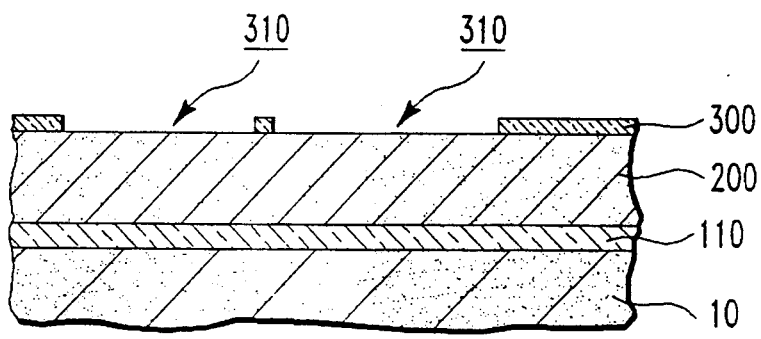

In FIG. 2, nitride layer 300 has formed therein two apertures 310 that will be the positions of the polish stops. The area between apertures 310 in device layer 200 are thick silicon mesas that will be polished down to form final silicon mesas for holding the transistors, illustratively field effect transistors.

Figure 3:
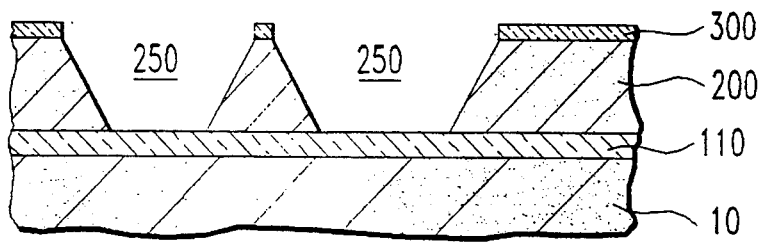

In the next step, shown in FIG. 3,, a wet etch of KOH (potassium hydroxide), has etched device layer 200 down to oxide layer 110, serving as an etch stop for the bottom of apertures 250. The slanting sidewalls of layer 200 form a very good etch stop, as silicon in the <100> orientation has very good etch resistance along the (111) crystal planes. Thus, the lateral dimensions of apertures 250 are very well controlled, since the etch extends down until oxide layer 110 is reached, after which the etching stops on the (111) planes that extend up from the oxide. For a layer 200 of thickness 1 $\mu m \pm 0.3$ $\mu m$, the nominal width of apertures 310 is set by the fact that the angle of the (111) plane with respect to the (001) plane is 54.7°. FIG. 3 shows a slight overhang for layer 300 because the (111) planes are not perfect etch stops. It has been observed that the amount of overhang is quite small, so that the apertures are easily controllable even with a conventional amount of overetch and the location of the final silicon mesas is well defined by the standards of submicron technology. Those skilled in the art will readily be able to calculate the required width of apertures 310 based on the desired width at the bottom of the aperture and the thickness of layer 200. The size of the final silicon mesas will be determined by the circuit layout and may range from one mesa per transistor to large mesas containing many transistors. Polish stop size and density will be determined by the mesa size and the polishing process. The density of polish stops will be set to avoid "dishing" of the mesas. Since the mesas are extremely thin, the density of polish stops will be high. Polish stops may extend to surround mesas or may be placed in the interior of large mesas.

Those skilled in the art will appreciate from FIG. 3 that there is a minimum size mesa for a given thickness of layer 200, set by the requirement that there be at least a predetermined minimum amount of nitride remaining above a mesa when the apertures are defined. For example, if there were no nitride left above the central mesa in FIG. 3, the two apertures 250 would merge into one big aperture. After the etch, the remainder of layer 300 is stripped in hot phosphoric acid.

As can be seen, the wet etch has removed a substantial amount of device layer 200, in contrast to a conventional polish stop process, in which the amount of material removed during the formation of the polish stop is small. The material removal process in this method is carried out in two separate steps—the first being the aperture definition process and the second being the chemical-mechanical polishing process. When the density of polish stops is high, more material may be removed in the aperture definition process than in the polishing process.

Figure 4:
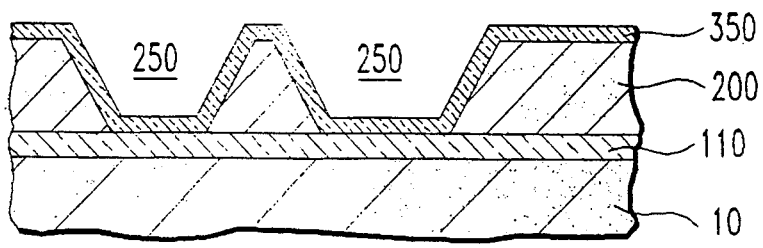

In FIG. 4, a layer of nitride 350 has been deposited to a controlled thickness of between 500 and 1000 Å, depending on the desired SOI device thickness, at the bottom of the aperture. The thickness on the sides of the aperture or the general horizontal surface does not matter. The parameters of this low pressure chemical vapor deposition (LPCVD) process are set as is known in the art in order to deposit an isotropic and uniform nitride layer. The preferred deposition temperature is about 780° C., but reasonable uniformity is produced above 600° C.

Figure 5:
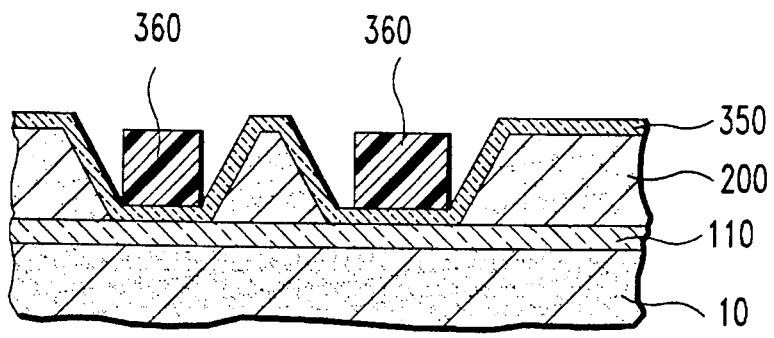

In the next figure, FIG. 5, photoresist 360 has been deposited and patterned in a conventional lithographic step to protect the nitride polish stop layer 350 in the bottom of apertures 250. This is a critical alignment step with a tolerance of ±0.1 μm in the embodiment illustrated. This tolerance will, of course, decrease as the technology improves.

Figure 6:
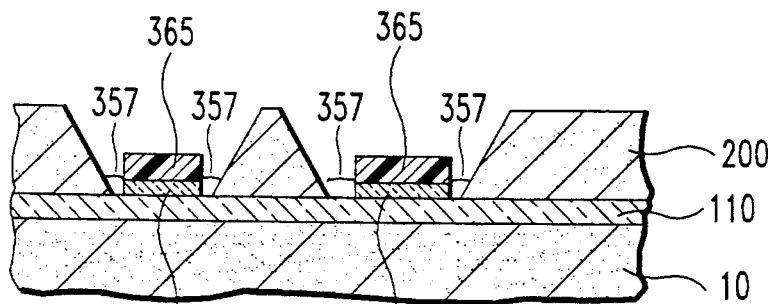

Next, as shown in FIG. 6, a reactive ion etch (RIE) step using $CHF_3 + CF_4 + Ar$ as an etching gas (and using end point detection on silicon) has removed nitride layer 350 from the unprotected areas and along the angled silicon surfaces and also reduced the thickness of the photoresist layer 360 to a residual amount denoted with the numeral 365. Photoresist 365 is stripped away, leaving a polish stop stud 355 in each aperture.

Figure 7:
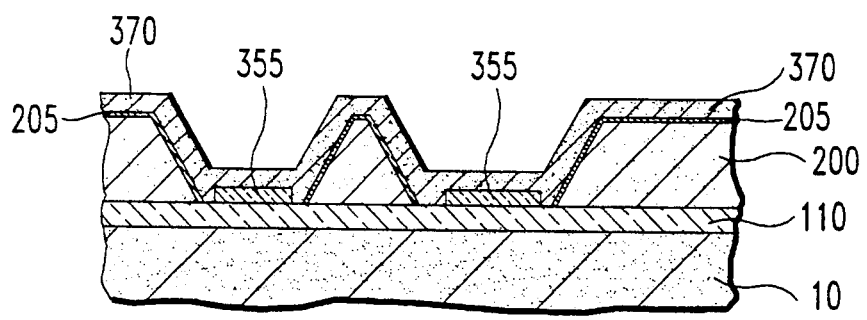

Next, an optional process step is shown in FIG. 7, in which a layer of polycrystalline silicon (poly) 370 is deposited over the wafer above 100 Å of oxide 205 that has been grown on the exposed silicon, as shown in FIG. 7. The thickness of poly layer 370 is not critical, being nominally greater in thickness than nitride layer 350. Poly layer 370 is an optional process step, its purpose being to provide mechanical support to the layer 200 during the polishing step. It has been found that polishing with an empty aperture causes damage to the exposed edges of the silicon and that this damage may propagate down to the silicon that is intended to hold the devices. Such damage is eliminated by the support of layer 370 which preferably fills apertures 250.

Poly layer 370 has the added virtue that it fills in the small empty spaces between nitride polish stops 355 and the remaining portion of device layer 200, indicated by the brackets labelled 357. This filling produces greater planarity in the final set of silicon mesas.

Figure 8:
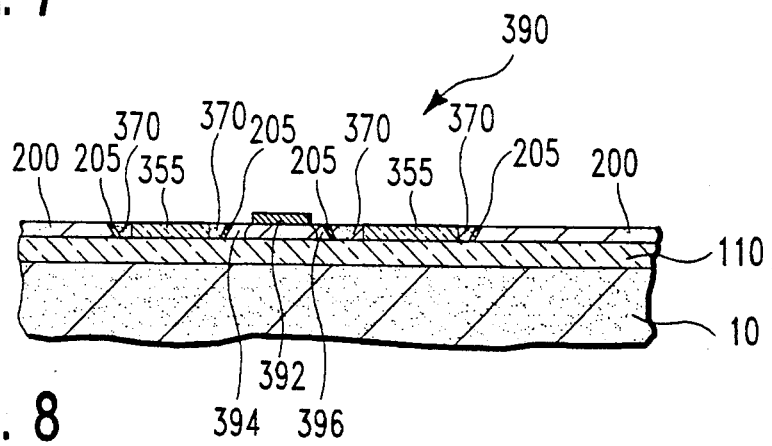

In the last figure, FIG. 8, a conventional chemical-mechanical polishing process has been performed using nitride buttons 355 as polish stops. The result is that device layer 200 has been thinned, leaving a set of silicon mesas 210 having the thickness of polish stops 355, and the uniformity of these same polish stops, nominally ±50 Å. Nitride polish stops 355 may be removed if desired to provide additional isolation between the silicon mesas of layer 200. A field effect transistor 390 having gate 392, drain 394 and source 396 is shown.

Illustratively, transistor 390 is a depletion type transistor having a gate width of 0.25 μm, a value of five times the thickness of mesa 210, illustratively 500 Å. Normally, one skilled in the art would not consider the use of a wet etch in connection with such dimensions because the variation in wet etches is known to be greater than that for dry etching techniques. The use of a wet etch necessarily leaves slanting sidewalls on the final mesas. This represents wasted silicon area, which is another reason why one skilled in the art would prefer a dry etch. Since the final mesa is so thin, the amount of area in the slanting sidewalls is small compared to the area of the transistor.

An advantage of the present invention is that the wet etching process does not sacrifice silicon area because of lateral etching. Ordinarily, wet etching is not considered for high definition processes such as that to be performed in the silicon mesas because of the lack of a lateral etch stop. Advantageously, any lateral overetch that may result because the (111) planes are not perfect etch stops is harmless because that material would have had to be polished away anyway. Thus, the alignment of the initial apertures 310 is not critical, and there is only one critical alignment in this process.

The invention illustrated may be readily modified by those skilled in the art. For example, layer 300 could be replaced with photoresist or oxide. Although nitride is preferred, the polish stop layer could be oxide, with appropriate changes in the etching gas.

Those skilled in the art will readily appreciate that different versions of the invention may be practiced in the light of the disclosure and the scope of the following claims is not intended to be limited to the embodiment disclosed.

We claim:

1. A method of thinning a device layer of silicon oriented with a <100> crystal orientation, having an initial device layer thickness and disposed above a buried oxide layer on a bonded SOI wafer, to form a set of final silicon mesas, comprising the steps of:

depositing a protective layer on the top surface of said device layer;

forming a set of apertures in said protective layer having aperture dimensions dependent on a final polish stop size;

wet etching a set of polish stop apertures in said device layer down to said buried oxide using an etchant that etches the <100> direction in preference to the <111> direction, whereby said (111) crystal planes serve as a lateral etch stop and said buried oxide serves as a vertical etch stop so that said polish stop apertures have slanting sidewalls on the (111) crystal planes of said device layer and a polish stop aperture bottom on said buried oxide;

depositing a polish stop layer on said polish stop aperture sidewalls and bottom, said polish stop layer having a polish stop thickness on said aperture bottom;

depositing and patterning a layer of photoresist above said polish stop layer to leave a protective photoresist plug on said aperture bottom;

removing said polish stop layer outside said protective plug, thereby leaving a set of polish stops having a polish stop surface between a set of thick silicon mesas having said slanting sidewalls in said polish stop apertures; and polishing said set of silicon mesas to said polish stop surface to form a set of final silicon mesas, whereby said final set of silicon mesas have said polish stop thickness.

2. A method according to claim 1, in which said step of removing said polish stop layer leaves a set of gaps on said polish stop aperture bottom between said set of polish stops and said set of thick silicon mesas; and further including a step of forming an isolating oxide coating on said slanting sidewalls and a step of depositing a layer of polycrystalline silicon to fill in said gaps between said polish stops and said thick silicon mesas, whereby edge damage on said slanting sidewalls during said polishing step is reduced.

3. A method according to claim 1, in which said polish stop layer is formed from nitride and said step of removing said polish stop layers is effected by a reactive ion etching step.

4. A method according to claim 3, in which said slanting sidewalls of said thick silicon mesas extend above said final silicon mesas, whereby said device layer is removed in two steps comprising said step of forming said set of apertures and said step of polishing said thick silicon mesas.

5. A method according to claim 1, in which said slanting sidewalls of said thick silicon mesas extend above said final silicon mesas, whereby said device layer is removed in two steps comprising said step of forming said set of apertures and said step of polishing said thick silicon mesas.

6. A method according to claim 5, in which said set of apertures are positioned and have dimensions such that at least a predetermined minimum amount of said protective layer remains above said final silicon mesas during said step of forming said set of apertures.

7. A method according to claim 2, in which said polish stop layer is formed from nitride and said step of removing said polish stop layers is effected by a reactive ion etching step.

8. A method according to claim 7, in which said slanting sidewalls of said thick silicon mesas extend above said final silicon mesas, whereby said device layer is removed in two steps comprising said step of forming said set of apertures and said step of polishing said thick silicon mesas.

9. A method according to claim 2, in which said slanting sidewalls of said thick silicon mesas extend above said final silicon mesas, whereby said device layer is removed in two steps comprising said step of forming said set of apertures and said step of polishing said thick silicon mesas.

10. A method according to claim 9, in which said set of apertures are positioned and have dimensions such that at least a predetermined minimum amount of said protective layer remains above said final silicon mesas during said step of forming said set of apertures.

* * * * *